March 15, 1960 J. C. MARINACE 2,928,162

JUNCTION TYPE SEMICONDUCTOR DEVICE HAVING IMPROVED
HEAT DISSIPATING CHARACTERISTICS
Filed Oct. 16, 1953

Inventor:
John C. Marinace,
by Howard D. Schlanker
His Attorney.

United States Patent Office 2,928,162

Patented Mar. 15, 1960

2,928,162

JUNCTION TYPE SEMICONDUCTOR DEVICE HAVING IMPROVED HEAT DISSIPATING CHARACTERISTICS

John C. Marinace, Schenectady, N.Y., assignor to General Electric Company, a corporation of New York Application October 16, 1953, Serial No. 386,437

5 Claims. (Cl. 29—25.3)

Figure 1:
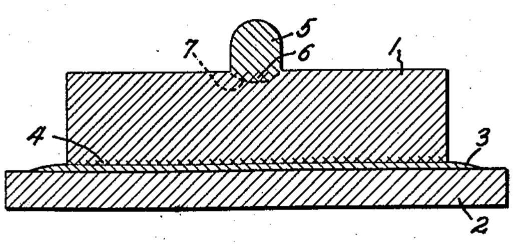
Figure 2:
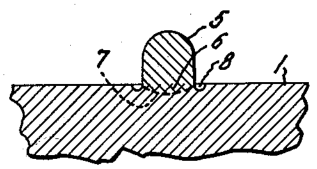
Figure 3:
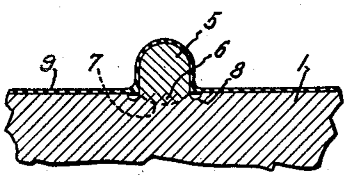

My invention relates to semiconductor electrical devices. More particularly it relates to dot junction type semiconductor electrical devices having improved heat dissipation qualities at the junction contact thereof by reason of a particular electrode structure.

Semiconductors such as prepared germanium and silicon are normally classified as either positive (P-type) or negative (N-type) depending primarily on the type and sign of their main electrical conduction carriers. In P-type semiconductors the conduction carriers are electron vacancies or holes produced by the movement of electrons in the valence band, whereas in N-type semiconductors the conduction carriers are electrons moving in the conduction band. The direction of rectification as well as the polarity of various voltage effects is different in semiconductors of the two types.

Whether a particular semiconductor is of the P-type or the N-type depends primarily on the type of impurity present in the material. Some impurities called "donors" such as antimony, phosphorus, and arsenic furnish additional free electrons to the semiconductor and produce an N-type material. Other impurities called "acceptors" such as aluminum, gallium, indium, and zinc tend to absorb electrons, leaving electron vacancies or holes in the material to produce a so-called P-type semiconductor. Only very small amounts of these impurities are required to produce marked electrical effects of one type or the other.

P–N junction semiconductor units are those in which a region of P-type semiconductor material adjoins a region of N-type material to form an internal space charge barrier called the "P–N junction." This P–N junction possesses marked rectifying as well as thermoelectric and photo-electric properties. An electric current may be passed easily in only one direction through a P–N junction and a generation or modulation of electrical current may be produced between the P-type and N-type materials by applying light or heat to the junction.

In some semiconductor devices, typified by a rectifier, it has been found convenient to provide a P–N junction by fusing in place on an N-type body, such as suitably prepared germanium or silicon, a small piece or a dot of a P-type material or impurity, such as indium, to form a junction with the body. Electrical contact is usually made with the indium particle by embedding therein a wire of suitable size. Such devices have found wide-spread use. Under operating conditions, however, the relatively higher resistant P–N junction heats and raises the temperature of the tectifier. While the relatively broad area of the rectifier serves to dissipate some of the operating heat, transfer through the surfaces is not sufficient to keep the temperature at a reasonably low level. Thus the bulk of the heat transfer or dissipation must take place by conduction through the small contact wire embedded in the indium dot electrode which is close to the heat-producing junction. Since the contact wire is too small to conduct such quantities of heat as to keep the rectifier at a reduced temperature, the latter may heat up to temperatures of 70° C. or more. The disadvantage of such heating will be at once apparent when it is realized that the leakage current in such rectifiers may double between 25° C. and 65° C. A broad area P–N junction such as is obtained by fusing to the germanium or silicon body a plate of acceptor material nearly as great in expanse as the surface of the body itself could be used in conjunction with a broad pressure contact such as one of graphite. However, it has been found that interelectrode leakage from broad area junctions is so excessive as to neutralize any heat dissipation advantages gained thereby.

An object of my invention is to provide a semiconductor device of the dot junction contact type which is characterized by efficient heat dissipation. Another object of my invention is to provide a semiconductor device of the dot junction contact type having improved performance and low leakage current under operating conditions.

Briefly my invention comprises a semiconductor device of the dot junction type in which a junction contact material of different conductivity type from the body is spread over a substantially greater area of the body surface than its actual contact or junction area, the spread or expanded surface being insulated from the semiconductor body. When a pressure contact, for example, graphite, is pressed against the widened expanded contact material, heat dissipation by conduction from the device is enhanced and the efficiency of its operation increased.

The features of my invention which I believe to be novel are set forth with particularity in the appended claims. My invention itself, however, both as to its organization and method of operation, together with further objects and advantages thereof may best be understood by reference to the following description taken in connection with the accompanying drawing and in which Figs. 1 through 5 show various stages in the fabrication of the semiconductor device of my invention.

It will be understood that while, for ease of description, I set forth my invention with respect to the use of certain materials, other materials, some of which will be specifically pointed out, and others of which will occur to those skilled in the art, may be used in connection therewith.

The semiconductor device to which I apply my invention is shown in Fig. 1 as comprising an N-type germanium wafer or body 1 typically about 0.04 inch square and about 0.020 inch thick. Body 1 is preferably, as is usual in the art, monocrystalline in nature and purified to have a resistivity over 2 ohm centimeters. Body 1 may conveniently be extracted from a monocrystalline germanium ingot grown by seed crystal withdrawal from a melt of germanium having a trace, less than 0.05 percent, of a donor impurity, such as antimony, which serves to impart to the body N-type conductivity. A first metal electrode 2 having a coefficient of thermal expansion comparable to that of the treated germanium body 1 such as fernico, is connected to the body by means of a solder 3. Preferably solder 3 consists of a relatively low melting point metal or metals having therein an impurity which enhances the type conductivity of the body 1. In this case the impurity would be of the donor type, imparting N-type conductivity, examples of which are arsenic, antimony, and phosphorus. A suitable solder is that described in copending application to Le Loup, Serial No. 316,861, filed October 25, 1952, and assigned to the same assignee as this invention. In the above-cited application the solder described consists of tin and from 0.1 percent to 10 percent by weight arsenic, and preferably between 1.0 percent and 5 percent arsenic.

Electrode 2 is fused to body 1 by heating solder 3 in contact with both preferably in a non-oxidizing or reducing atmosphere at temperatures ranging up to 700°

C. The fusion is of a time-temperature nature and temperatures from about 250° C. to 700° C. may be used for times ranging from a few seconds to several hours. Temperatures over about 700° C. are generally undesirable because the melting process is then too fast and uncontrollable. The time-temperature relationship is adjusted to allow solder 3 to wet and alloy with the adjacent surfaces of wafer or body 1 and electrode 2, this action taking place in about 10 seconds at a temperature of 700° C. Since the particular solder described in detail has a slow rate of diffusion relative to germanium, there is little likelihood of impregnating the entire body 1 with the material of solder 3. The fusion of solder 3 to body 1 produces a heavily N-type region 4 as a result of negative conduction carriers furnished by the arsenic or other donor in the solder. It will be understood, of course, that such extra donor material need not be used though it preferably is included.

A second electrode 5 of a ductile acceptor material such as indium is fused to the opposite or a remote surface of body 1 relative to electrode 2. While indium electrode 5 may be fused to body 1 in the same step in which solder 3 is fused thereto, I prefer to join the indium electrode in a separate step, preferably in a nonoxidizing or reducing atmosphere at a temperature of 500° C. to 600° C. The fusion process in this temperature range takes about 10 seconds.

The fusion of the indium electrode 5 to body 1 produces a P-type region at the boundary between the electrode and the body. This region 6 serves as a source of excess positive conduction carriers or electron vacancies or holes as they are variously called. A P–N junction 7 is formed at the limit of diffusion of acceptor material indium into body 1. The exact location and character of this junction depends on the temperature and time used in fusing the acceptor material to the body. For short periods of treatment at the lower temperatures indicated above a rather shallow penetration of acceptor material takes place, the depth of diffusion increasing with time and temperature. It will be appreciated that the resistance of the P–N junction 7 is less at the exposed boundary where the surface of body 1 and electrode 5 are joined due to the relatively low diffusion of acceptor material thereat. However, as we progress downward into region 6 and to its lower parts, or P–N junction 7 itself, the resistance increases. In order to take advantage of the highest possible junction resistance with its attendant benefits to the performance of the semiconductor device, I treat the device with an etching solution which will preferentially etch the exposed indium-germanium boundary and consume the lower resistance parts of the junction 7 producing a moat or annular recess 8 around electrode 5. Any of a number of solutions may be used in this process, such solution usually including nitric acid and hydrofluoric acid. An especially useful etch solution is one consisting of, by volume, 80 percent nitric acid, 15 percent hydrofluoric acid, 3 percent acetic acid and about 2 percent of bromine. Electrolytic etches may also be used. Generally an etching time of from about 5 to 10 seconds is sufficient, though this time will vary from solution to solution in a manner well-known to those skilled in the art. A moat or recess about 0.1 millimeter deep in a rectifier of the above general size is usually produced by the described treatment. The device is thoroughly washed in water or other solvent to remove all traces of the etching solution.

The crux of my invention, as pointed out above, is the provision of a broad contact area for the indium dot electrode. To obtain the advantages of the relatively small P–N junction with its high resistance and reduced tendency to leak current as compared to a broad area junction and yet have a large area to dissipate heat formed at the junction, I flatten out or spread the indium electrode 5 over the surface of the body 1 by means of pressure applied thereto. However, the advantages recited above would largely be lost if the electrode 5 were simply spread out in direct contact with the surface of the body 1 with resultant current leakage and short-circuiting.

In order to obtain a large electrode heat transfer area without the disadvantages of current leakage and short circuiting I provide a layer of insulating material under the expanded indium electrode or between the electrode and wafer or body surface. This may be done in any of a number of ways. For example, the entire device may be dipped in an insulating varnish or resin and the insulation cured to produce an insulating coating such as 9 in Fig. 3. The indium electrode 5 is then flattened by any suitably applied vertical pressure which causes it to spread outwardly over the insulation 9 to an area non-critical as to size but suited to requirements which is typically four to five times the area of the original electrode-body contact area to produce a good heat dissipating electrode such as that shown at 10 in Fig. 5. Insulation 9 breaks away from the physically worked or flattened electrode surface during the pressing operation. A non-brittle insulation is, of course, used. Instead of dipping the entire device in the insulating material, the latter may be sprayed or brushed on the device either over the entire surface thereof or on the upper surface or even selectively on the surface surrounding the indium electrode. Typical dipping, brushing or spraying insulations which may be used are varnishes or solutions of oleophenolic, epoxymelamine, acrylic, vinyl, polystyrene, polyethylene, and phenol formaldehyde resins. Inorganic films or coatings as of alumina, silica, germanium oxide, and titanium oxide may also be used to advantage.

Figure 4:
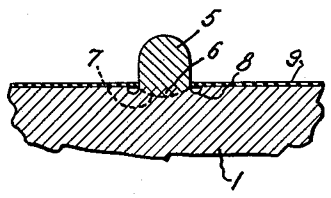
Figure 5:
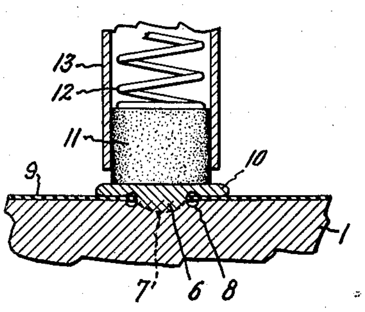

Alternatively, sheets of insulating material may be placed around the unpressed indium electrode 5 as at 9 in Fig. 4 and the electrode flattened as above to produce the structure shown in Fig. 5. Care should be taken to have the insulating sheet, such as of the resins listed above or inorganic material such as mica and the like, fit closely around the periphery of electrode 5. This insures that the insulation in the final product will extend over the moat 8 to prevent shorting between the electrode and that part of body 1 other than junction 7. The electrode 10 of my improved semiconductor device may be used in conjunction with any contact but preferably a pressure contact such as graphite contact 11 of broad area biased by spring 12 and which may be mounted as in a metal sleeve 13 to insure even better dissipation of heat from the large area of electrode 10.

While I have described this invention in particularity with reference to a semiconductor device having an N-type germanium body enriched at one surface by an arsenicc donor material and having an indium acceptor material for a second electrode, it will be appreciated that other materials may also be used in the practice of the invention. Thus, instead of an N-type germanium body I may use an N-type silicon body. In lieu of the arsenic donor material I may use phosphorus or antimony or other donors. Likewise, in lieu of the indium electrode I may utilize any other suitable ductile acceptor material, examples of which are thallium, aluminum, and zinc, although I prefer to use indium. The teachings of this invention may also be applied to semiconductor devices in which the main body is of a P-type conductor material such as suitably enriched germanium or silicon. In this case the base or one surface of the body would be enriched with an acceptor material such as aluminum, gallium, indium, or zinc among others, while the electrode corresponding to electrode 5 would be a ductile material comprising antimony, phosphorus, or arsenic. An electrode of the solder described above could serve as such an electrode. Alternatively, all electrodes or any desired number of the electrodes may be of the dot type.

By this invention I have provided an improved heat dissipating electrode for semiconductor devices which is also characterized by low leakage and lack of short-circuiting. While I described this invention in connection with certain specific embodiments and examples, I wish it to be understood that I desire to protect in the following claims all variations of my invention which do not depart from the spirit or scope thereof.

What I claim as new and desire to secure by Letters Patent of the United States is:

1. The method of making a semiconductor device which comprises attaching a first electrode to one surface of such a conductor body, fusing to another surface of said body an electrode material, placing insulating material around said electrode material on the surface of said body and applying pressure to said electrode material to cause it to flatten out over the insulating material on the surface of said body.

2. The method of making a semiconductor device which comprises attaching a first electrode to one surface of a semiconductor body, fusing to another surface of said body an electrode material, coating said electrode material and the surface of said body surrounding it with an insulating material and applying pressure to said electrode material to cause it to flatten out over the insulating material on the surface of said body.

3. The method of making a semiconductor device which comprises attaching a first electrode to one surface of a semiconductor body, fusing to another surface of said body an electrode material, coating the surface of said body surrounding said material with an insulating material and applying pressure to said electrode material to cause it to flatten out over the insulating material on the surface of said body.

4. The method of making a semiconductor device which comprises impregnating a surface of a body of one type conductivity with a material having the same type conductivity, fusing to another surface of said body a material having a type conductivity opposite to that of said body, coating said opposite type material and the surface of said body surrounding it with an insulating material and applying pressure to said opposite type conductivity material to cause it to flatten out over the insulating material on the surface of said body.

5. The method of making an electrode for a semiconductor device which comprises fusing the electrode material to a surface of a semiconductor body and applying pressure to said material to spread it out over the surface of insulating material interposed between said material and said body except at their junction.

References Cited in the file of this patent

UNITED STATES PATENTS

| | | |
|---|---|---|
| 2,381,025 | Addink | Aug. 7, 1945 |
| 2,444,255 | Hewlett | June 29, 1948 |
| 2,745,044 | Lingel | May 8, 1956 |
| 2,754,455 | Pankove | July 10, 1956 |
| 2,776,920 | Dunlap | Jan. 8, 1957 |
| 2,781,480 | Mueller | Feb. 12, 1957 |
| 2,796,562 | Ellis et al. | June 18, 1957 |